(12) United States Patent
Sakakibara et al.

(10) Patent No.: US 12,232,345 B2
(45) Date of Patent: Feb. 18, 2025

(54) LIGHT-EMITTING DEVICE FOR IMPROVING INTERNAL QUANTUM EFFICIENCY

(71) Applicant: SHARP KABUSHIKI KAISHA, Sakai (JP)

(72) Inventors: Yusuke Sakakibara, Sakai (JP); Masaki Yamamoto, Sakai (JP); Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 334 days.

(21) Appl. No.: 17/761,494

(22) PCT Filed: Sep. 27, 2019

(86) PCT No.: PCT/JP2019/038108
§ 371 (c)(1),
(2) Date: Mar. 17, 2022

(87) PCT Pub. No.: WO2021/059472
PCT Pub. Date: Apr. 1, 2021

(65) Prior Publication Data
US 2022/0367825 A1    Nov. 17, 2022

(51) Int. Cl.
*H10K 50/115*    (2023.01)
*H10K 50/11*    (2023.01)
*H10K 50/805*    (2023.01)
*H10K 59/35*    (2023.01)

(52) U.S. Cl.
CPC ......... *H10K 50/115* (2023.02); *H10K 50/805* (2023.02)

(58) Field of Classification Search
CPC ...... H10K 50/115; H10K 50/11; H10K 59/35; H10K 2102/351
See application file for complete search history.

(56) References Cited

U.S. PATENT DOCUMENTS

| 10,388,902 | B1 * | 8/2019 | Palles-Dimmock | H10K 50/115 |
| 11,133,489 | B2 * | 9/2021 | Ichikawa | H10K 59/38 |
| 2011/0297218 | A1 * | 12/2011 | Lee | B82Y 10/00 977/890 |
| 2013/0193427 | A1 | 8/2013 | Kurata et al. | |
| 2020/0161577 | A1 * | 5/2020 | Kang | H10K 50/11 |

(Continued)

FOREIGN PATENT DOCUMENTS

WO   2012/070087 A1   5/2012

*Primary Examiner* — Chad M Dicke
*Assistant Examiner* — Jeremy Daniel Watts
(74) *Attorney, Agent, or Firm* — ScienBiziP, P.C.

(57) ABSTRACT

A light-emitting device includes a first sub-pixel provided with a first light emitter, and a second sub-pixel provided with a second light emitter and constituting, together with the first sub-pixel, one of a plurality of pixels. The first light emitter has a first cathode, a first anode, and a first light-emitting layer containing a first quantum dot and disposed between the first cathode and the first anode. The second light emitter has a second cathode, a second anode, and a second light-emitting layer containing a second quantum dot and disposed between the second cathode and the second anode. The second quantum dot emits light having a longer light-emission wavelength than the first quantum dot. The first light-emitting layer is thicker than the second light-emitting layer.

1 Claim, 10 Drawing Sheets

(56) References Cited

U.S. PATENT DOCUMENTS

2020/0411784 A1\* 12/2020 Jang ................. H10K 59/38
2021/0408160 A1\* 12/2021 Yuan ................ H10K 59/1213
2023/0292541 A1\* 9/2023 Handa .............. H10K 50/16

\* cited by examiner

LIGHT-EMITTING DEVICE FOR IMPROVING INTERNAL QUANTUM EFFICIENCY

TECHNICAL FIELD

The disclosure relates to a light-emitting device.

BACKGROUND ART

Patent Literature 1 discloses an organic electroluminescence (EL) panel that has pixels each including an organic light-emitting layer made of an organic EL material. Patent Literature 1 describes that the thickness of a red light-emitting layer, which emits red light, is the largest, followed by the thickness of a green light-emitting layer, which emits green light, followed by the thickness of a blue light-emitting layer, which emits blue light. Patent Literature 1 describes that this thickness difference can enhance the efficiency of taking light individually out of the red, green and blue light-emitting layers.

CITATION LIST

Patent Literature

Patent Literature 1: WO2012/070087

SUMMARY

Technical Problem

The organic EL panel described in Patent Literature 1 unfortunately involves a loss of a carrier balance, which is a balance between holes and electrons, in the blue light-emitting layer, thus degrading internal quantum efficiency. One aspect of the disclosure is to improve a carrier balance within a light-emitting layer, thus improving internal quantum efficiency.

Solution to Problem

A light-emitting device according to one aspect of the disclosure includes a first sub-pixel provided with a first light emitter, and a second sub-pixel provided with a second light emitter and constituting, together with the first sub-pixel, a first pixel of a plurality of pixels. The first light emitter has a first cathode, a first anode, and a first light-emitting layer containing a first quantum dot and disposed between the first cathode and the first anode. The second light emitter has a second cathode, a second anode, and a second light-emitting layer containing a second quantum dot and disposed between the second cathode and the second anode. The second quantum dot emits light having a longer light-emission wavelength than the first quantum dot. The first light-emitting layer is thicker than the second light-emitting layer.

Advantageous Effect of Disclosure

The light-emitting device according to the aspect of the disclosure can improve a carrier balance within a light-emitting layer, thus improving internal quantum efficiency.

DESCRIPTION OF EMBODIMENTS

In the following description, the term "in the same layer" refers to that one layer is formed in the same process step (film formation step) as a comparative layer. In addition, the term "in a lower layer than (or under)" refers to that one layer is formed in a process step anterior to a process step of forming a comparative layer. In addition, the term "in a higher layer than (or above)" refers to that one layer is formed in a process step posterior to a process step of forming a comparative layer.

First Embodiment

Figure 1:
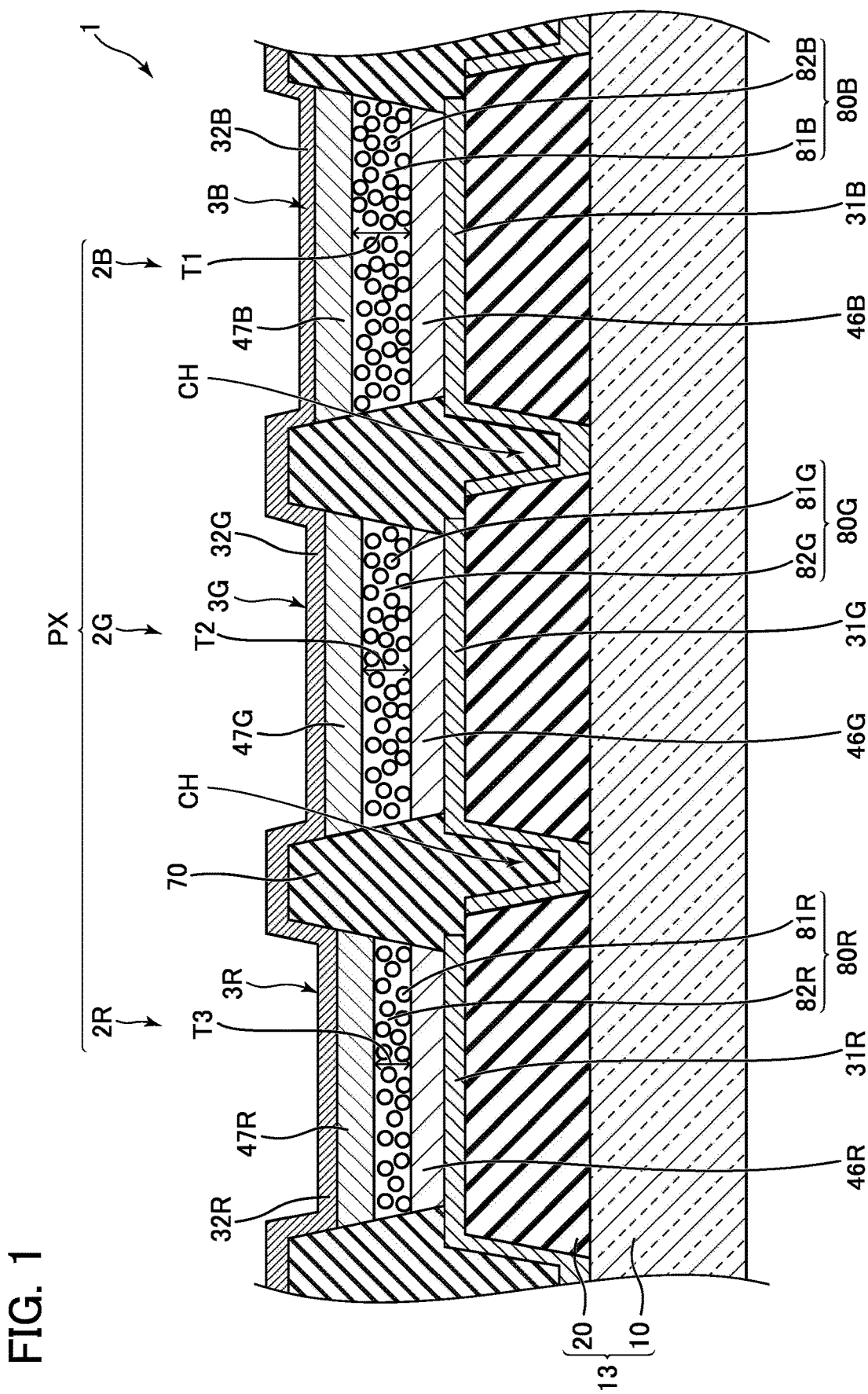
FIG. 1 is a schematic sectional view of the configuration of a light-emitting device according to a first embodiment.

FIG. 1 is a schematic sectional view of the configuration of a light-emitting device 1 according to this embodiment. The light-emitting device 1 is used in displays of TV sets, smartphones, and other equipment. As illustrated in FIG. 1, the light-emitting device 1 in this embodiment has a plurality of pixels PX arranged on an array substrate 10. Each pixel PX includes sub-pixels 2B, 2G, and 2R. In other words, the sub-pixels 2B, 2G, and 2R constitute a single pixel PX by way of example.

A sub-pixel 2B (first sub-pixel) emits blue light (first light), which is light having a blue light-emission wavelength. A sub-pixel 2G (second sub-pixel, first sub-pixel) emits green light (second light, first light), which is light having a green light-emission wavelength longer than the blue light-emission wavelength. A sub-pixel 2R (third sub-pixel, second sub-pixel) emits red light (third light, second light), which is light having a red light-emission wavelength longer than the green light-emission wavelength. By way of example, the sub-pixel 2G is adjacent to the sub-pixel 2R in a plan view. In addition, the sub-pixel 2B is adjacent to the sub-pixel 2G in the plan view. It is noted that the order of arrangement of the sub-pixels 2R, 2G and 2B is changeable freely.

It is noted that blue light refers to light having a light-emission center wavelength that falls within a wavelength band of 400 to 500 nm inclusive. It is also noted that green light refers to light having a light-emission center wavelength that falls within a wavelength band greater than 500 nm and equal to or smaller than 600 nm. It is also noted that red light refers to light having a light-emission center wavelength that falls within a wavelength band greater than 600 nm and equal to or smaller than 780 nm.

Light emitters 3B, 3G, and 3R are disposed in a region sectioned by an insulating bank 70 (pixel restricting layer), which is disposed on the array substrate 10. The light emitter 3B is included in the sub-pixel 2B, the light emitter 3G is included in the sub-pixel 2G, and the light emitter 3R is included in the sub-pixel 2R.

The array substrate 10 is provided with TFTs or thin-film transistors (not shown), which are provided for regulating the emission and non-emission of light from each light emitter 3. The array substrate 10 in this embodiment is composed of a flexible resin layer with TFTs thereon. The resin layer in this embodiment is composed of a resin film (e.g., a polyimide film) with a barrier layer, which is herein an inorganic insulating film (e.g., a silicon oxide film, a silicon nitride film, or a silicon oxide nitride film), stacked thereon. In some embodiments, the array substrate 10 may be composed of a rigid substrate (e.g., a glass substrate) with TFTs thereon. The array substrate 10 in this embodiment has an upper surface with an interlayer insulating film 20 (flattening film) thereon. The interlayer insulating film 20 is made of a material, such as polyimide or acrylic. The interlayer insulating film 20 has a plurality of contact holes CH. In the following description, the array substrate 10 and the interlayer insulating film 20, disposed on the upper surface of the array substrate 10, are together also referred to as a substrate 13.

In this embodiment, the light emitter (first light emitter) 3B, included in the sub-pixel 2B, has the following by way of example: an anode (first anode) 31B; a hole transport layer (first hole transport layer) 46B overlapping the anode 31B; a light-emitting layer (first light-emitting layer) 80B overlapping the hole transport layer 46B; an electron transport layer (first electron transport layer) 47B overlapping the light-emitting layer 80B; and a cathode (first cathode) 32B overlapping the electron transport layer 47B. In addition, the light emitter (second light emitter, first light emitter) 3G, included in the sub-pixel 2G, has the following: an anode (second anode, first anode); a hole transport layer (a second hole transport layer, the first hole transport layer) 46G overlapping the anode 31G; a light-emitting layer (second light-emitting layer, first light-emitting layer) 80G overlapping the hole transport layer 46G; an electron transport layer (second electron transport layer, first electron transport layer) 47G overlapping the light-emitting layer 80G; and a cathode (second cathode, first cathode) 32G overlapping the electron transport layer 47G. In addition, the light emitter (third light emitter, second light emitter) 3R, included in the sub-pixel 2R, has the following: an anode (third anode, second anode) 31R; a hole transport layer (third hole transport layer, second hole transport layer) 46R overlapping the anode 31R; a light-emitting layer (third light-emitting layer, second light-emitting layer) 80R overlapping the hole transport layer 46R; an electron transport layer (third electron transport layer, second electron transport layer) 47R overlapping the light-emitting layer 80R; and a cathode (third cathode, second cathode) 32R overlapping the electron transport layer 47R.

The anode 31B injects holes into the hole transport layer 46B. The anode 31G injects holes into the hole transport layer 46G. The anode 31R injects holes into the hole transport layer 46R. As illustrated in FIG. 1, the anodes 31B, 31G, and 31R in the this embodiment are disposed, on the interlayer insulating film 20, in the form of an island in respective regions constituting the sub-pixels 2B, 2G and 2R (i.e., in the respective light emitters 3B, 3G and 3R). The anodes 31B, 31G, and 31R are electrically connected to respective TFTs (not shown) via the contact holes CH, which are bored in the interlayer insulating film 20. The anodes 31B, 31G, and 31R are structured in such a manner that, for instance, metal including Al, Cu, Au or Ag, all of which have high reflectivity of visible light, and ITO, IZO, IZO, ZnO, AZO, BZO or GZO, all of which are transparent materials, are stacked on the array substrate 10 in this order. A first electrode 31 is formed through sputtering or evaporation for instance.

The bank 70 covers the contact holes CH. The bank 70 is formed by, for instance, application of an organic material, such as polyimide or acrylic, onto the array substrate 10, followed by patterning through photolithography. The bank 70 in this embodiment covers the edges of the individual anodes 31B, 31G and 31R, as illustrated in FIG. 1. That is, the bank 70 in this embodiment serves also as an edge cover of each of the anodes 31B, 31G and 31R. Such a configuration can prevent an excessive electric field at the edges of the individual anodes 31B, 31G and 31R.

The hole transport layer 46B transports the holes injected from the anode 31B, further to the light-emitting layer 80B. The hole transport layer 46G transports the holes injected from the anode 31G, further to the light-emitting layer 80G. The hole transport layer 46R transports the holes injected from the anode 31R, further to the light-emitting layer 80R. The hole transport layer 46B is disposed between the anode 31B and light-emitting layer 80B and on the anode 31B, and the hole transport layer 46B is electrically connected to the anode 31B. The hole transport layer 46G is disposed between the anode 31G and light-emitting layer 80G and on the anode 31G, and the hole transport layer 46G is electrically connected to the anode 31G. The hole transport layer 46R is disposed between the anode 31R and light-emitting layer 80R and on the anode 31R, and the hole transport layer 46R is electrically connected to the anode 31R. The hole transport layers 46B, 46G and 46R in this embodiment are disposed in the form of an island in respective regions defining the sub-pixels 2B, 2G and 2R (in other words, in the respective light emitters 3B, 3G and 3R).

The hole transport layers 46B, 46G, and 46R each contain a hole transport material. The hole transport layers 46B, 46G, and 46R may contain, for instance, polyethylenedioxythiophene/polystyrenesulfonate (PEDOT:PSS), poly-N-vinylcarbazole (PVK), poly[(9,9-dioctylfluorenyl-2,7-diyl)-co-(4,4'-(N-(4-sec-butylphenyl)diphenylamine))](TFB), or N,N'-bis(4-butylphenyl)-N,N'-bis(phenyl)-benzidine (poly-TPD). Alternatively, the hole transport layers 46B, 46G, and 46R may contain a plurality of materials among these materials. The hole transport layers 46B, 46G, and 46R are formed through, but not limited to, an ink-jet method, evaporation using a mask, or photolithography using a mask. The hole transport layers 46B, 46G, and 46R may contain respective hole transport materials different from each other. By way of example, the hole transport layers 46B, 46G, and 46R in this embodiment contain a hole transport material of the same kind.

The light-emitting layer 80B is disposed between the cathode 32B and anode 31B. To be specific, the light-emitting layer 80B in this embodiment is disposed between the hole transport layer 46B and electron transport layer 47B. Moreover, the light-emitting layer 80G is disposed between the cathode 32G and anode 31G. To be specific, the light-emitting layer 80G in this embodiment is disposed between the hole transport layer 46G and electron transport layer 47G. Moreover, the light-emitting layer 80R is disposed between the cathode 32R and anode 31R. To be specific, the light-emitting layer 80R in this embodiment is disposed between the hole transport layer 46R and electron transport layer 47R. The light-emitting layers 80B, 80G, and 80R are formed through, but not limited to, an ink-jet method, evaporation using a mask, or photolithography using a mask.

The light-emitting layer 80B contains a quantum dot (first quantum dot) 81B. The light-emitting layer 80G contains a quantum dot (second quantum dot, first quantum dot) 81G. The light-emitting layer 80R contains a quantum dot (third quantum dot, second quantum dot) 81R.

The quantum dots 81B, 81G, and 81R each have a valence band level (equal to an ionization potential) and a conduction band level (equal to an electron affinity) and are each a material that emits light upon rejoining of holes at the valence band level and electrons at the conduction band level together. Light emitted from the quantum dots 81B, 81G and 81R has a narrow spectrum due to a quantum confinement effect, and hence the emitted light can have relatively deep chromaticity.

The quantum dot 81B emits blue light. The quantum dot 81G emits green light, which has a longer light-emission wavelength than blue light. The quantum dot 81R emits red light, which has a longer light-emission wavelength than green light.

The quantum dots 81B, 81G, and 81R may each contain CdSe, ZnSe, CdZnSe, or InP for instance. The quantum dots 81B, 81G, and 81R may be each a semiconductor nanoparticle having a core-shell structure with a core and shell. The quantum dots 81B, 81G and 81R in this embodiment have a core-shell structure with CdSe serving as a core, and with ZnS serving as a shell. Further, the perimeter of the shell in the light-emitting layer 80B may coordinate with a ligand 82B, the perimeter of the shell in the light-emitting layer 80G may coordinate with a ligand 82G, and the perimeter of the shell in the light-emitting layer 80R may coordinate with a ligand 82R. The ligands 82B, 82G, and 82R are composed of an organic substance, including thiol and amine.

By way of example, the quantum dots 81B, 81G, and 81R may be configured in the following manner. That is, one of any two of the quantum dots 81B, 81G and 81R has a first core and a first shell covering the first core. In addition, the other quantum dot has a second core and a second shell covering the second core. The first core has composition expressed by General Formula (1) below.

$$A_{x1}B_{1-x1}C \quad (1)$$

The second core preferably belongs to the same composition group as the first core and has composition expressed by General Formula (2) below.

$$A'_{x3}B'_{1-x3}C' \quad (2)$$

In General Formulas (1) and (2), A and A' are the same element and are an element selected from among the group 12 elements (e.g., Zn and Cd) or group 13 elements (e.g., In). In addition, B and B' are the same element and are an element selected from among elements belonging to the same group as A and different from A. In addition, C or C' is one or more elements selected from among the group 16 elements (e.g., Se or Te) when A and B are group 12 elements, and C or C' is one or more elements selected from among the group 15 elements (e.g., P) when A and B are group 13 elements. In addition, $|X1-X3|\leq 0.2$ is satisfied. In addition, $0\leq X1\leq 1$ and $0\leq X3\leq 1$ are satisfied.

At least one of A and B may have a smaller atomic number than Hg.

Examples of the quantum dot 81B include ZnO, ZnS, ZnSe, ZnTe, CdO, CdS, CdSe, CdTe, $Cd_{0.25}Ze_{0.75}Se$, GaN, GaP, GaAs, InN, InP, InAs, $In_{0.25}Ga_{0.75}N$, $In_{0.25}Ga_{0.75}P$. The quantum dots 81G and 81R are preferably CdSe when the quantum dot 81B is CdSe, and the quantum dots 81G and 81R are preferably $Cd_{0.2}Ze_{0.75}Se$ when the quantum dot 81B is $Cd_{0.25}Ze_{0.75}Se$.

The first and second shells may be a material that is selected as appropriate in accordance with the material of the first and second cores and is publicly known in the field.

The quantum dots 81B, 81G, and 81R each have a particle diameter of about 3 to 15 nm for instance. The wavelength of light emitted from the quantum dots 81B, 81G and 81R can be regulated by the particle diameter of the quantum dots 81B, 81G and 81R. Accordingly, regulating the particle diameters of the quantum dots 81B, 81G and 81R individually can obtain the respective colors of emitted light. The average particle diameter of a plurality of quantum dots 81B contained in the light-emitting layer 80B is smaller than the average particle diameter of a plurality of quantum dots 81G contained in the light-emitting layer 80G. The average particle diameter of a plurality of quantum dots 81G contained in the light-emitting layer 80G is smaller than the average particle diameter of a plurality of quantum dots 81R contained in the light-emitting layer 80R.

The quantum dots 81B, 81G, and 81R may contain respective materials different from each other. By way of example, the quantum dots 81B, 81G and 81R in this embodiment contain the same material and have mutually different particle diameters.

In the light-emitting device 1 according to this embodiment, the thickness, T1, of the light-emitting layer 80B is larger than the thickness, T2, of the light-emitting layer 80G and the thickness, T3, of the light-emitting layer 80R. In addition, the thickness T2 of the light-emitting layer 80G is larger than the thickness T3 of the light-emitting layer 80R.

For instance, the thickness T1 of the light-emitting layer 80B is the thickness of the center of the light-emitting layer 80B, the thickness T2 of the light-emitting layer 80G is the thickness of the center of the light-emitting layer 80G, and the thickness T3 of the light-emitting layer 80R is the thickness of the center of the light-emitting layer 80R. The thickness of each light-emitting layer can be determined by, for instance, cutting out the section of a pixel and measuring the pixel section with a scanning electron microscope (SEM), a transmission electron microscopy (TEM/STEM), or other types of microscope. The light-emitting layers 80B, 80G, and 80R will be detailed later on.

The electron transport layer 47B transports the electrons injected from the cathode 32B, further to the light-emitting layer 80B. The electron transport layer 47G transports the electrons injected from the cathode 32G, further to the light-emitting layer 80G. The electron transport layer 47R transports the electrons injected from the cathode 32R, further to the light-emitting layer 80R. The second electron transport layers 47B, 47G, and 47R may have the function of preventing hole transport to the cathodes 32B, 32G, and 32R (i.e., a hole blocking function). The electron transport layer 47B is disposed between the cathode 32B and light-emitting layer 80B and on the light-emitting layer 80B. The electron transport layer 47G is disposed between the cathode 32G and light-emitting layer 80G and on the light-emitting layer 80G. The electron transport layer 47R is disposed between the cathode 32R and light-emitting layer 80R and on the light-emitting layer 80R. The electron transport layers 47B, 47G and 47R in this embodiment are disposed in the form of an island in respective regions defining the sub-pixels 2B, 2G and 2R (in other words, in the respective light emitters 3B, 3G and 3R).

The electron transport layers 47B, 47G, and 47R may each contain ZnO, ZnMgO, or 1,3,5-tris(1-phenyl-1H-benzimidazole-2-yl)benzene (TPBi), or the electron transport layers 47B, 47G, and 47R may each contain a plurality of materials among these materials. The electron transport layers 47B, 47G, and 47R are formed through, but not limited to, an ink-jet method, evaporation using a mask, or photolithography using a mask. The electron transport layers 47B, 47G, and 47R may contain respective electron transport materials different from each other. By way of example, the electron transport layers 47B, 47G and 47R in this embodiment contain the same electron transport material.

The cathode 32B is disposed on the electron transport layer 47B and is electrically connected to the electron transport layer 47B. The cathode 32G is disposed on the electron transport layer 47G and is electrically connected to the electron transport layer 47G. The cathode 32R is disposed on the electron transport layer 47R and is electrically connected to the electron transport layer 47R. The cathode 32B injects electrons into the electron transport layer 47B. The cathode 32G injects electrons into the electron transport layer 47G. The cathode 32R injects electrons into the electron transport layer 47R. The cathodes 32B, 32G and 32R in this embodiment are provided as a single continuous layer extending across the plurality of sub-pixels 2B, 2G and 2R (i.e., the light emitters 3B, 3G and 3R).

The cathodes 32B, 32G, and 32R are made of, for instance, metal or transparent material processed into a film that is thin enough to allow light to pass therethrough. Examples of the metal constituting the cathodes 32B, 32G and 32R include metals, including Al, Ag and Mg. Moreover, examples of the transparent material constituting the cathodes 32B, 32G and 32R include ITO, IZO, ZnO, AZO, BZO and GZO. The cathodes 32B, 32G, and 32R are formed through sputtering or evaporation for instance.

Disposed on the cathodes 32B, 32G and 32R is a sealing layer (not shown). The sealing layer includes the following for instance: an inorganic sealing film covering the cathodes 32B, 32G and 32R; an organic layer located in a higher layer than the inorganic sealing film and is composed of an organic buffer layer; and an inorganic sealing film located in a higher layer than the organic buffer layer. The sealing layer prevents foreign substances, such as water and oxygen, from intruding into the inside of the light-emitting device 1. The inorganic sealing films are inorganic insulating films. The inorganic sealing films are composed of a silicon oxide film, a silicon nitride film, or a silicon oxide nitride film, all of which are formed through CVD for instance, or are composed of a laminated film of these materials. The organic buffer layer is a light-transparency organic film that flattens a layer or film, and the organic buffer layer can be made of an organic material that can be applied, such as acrylic. Further, a function film (not shown) may be disposed on the sealing layer. The function film may serve as at least one of an optical compensator, a touch sensor and a protector for instance.

The holes injected from the anodes 31B, 31G and 31R are respectively transported through the hole transport layers 46B, 46G and 46R to the light-emitting layers 80B, 80G and 80R. In addition, the electrons injected from the cathodes 32B, 32G and 32R are respectively transported through the electron transport layers 47B, 47G and 47R to the light-emitting layers 80B, 80G and 80R. The holes and electrons transported to the light-emitting layers 80B, 80G and 80R rejoin together within the quantum dots 81B, 81G and 81R, thus generating excitons. The excitons then change from an excitation state back to a ground state, and thus the quantum dots 81B, 81G and 81R emit light. The light-emitting device 1 in this embodiment is a top-emission type, where light emitted from the light-emitting layers 80B, 80G and 80R is taken out via the opposite side of the array substrate 10 (i.e., from above in FIG. 1). In some embodiments, the light-emitting device 1 may be a bottom-emission type, where light is taken out via the array substrate 10 (i.e., from below in FIG. 1). In this case, the cathode 32B, 32G and 32R need to be reflective electrodes, and the anodes 31B, 31G and 31R need to be transparent electrodes.

The light-emitting device 1 in this embodiment includes the following stacked sequentially on the array substrate 10: the anodes 31B, 31G, and 31R; the hole transport layers 46B, 46G, and 46R; the light-emitting layers 80B, 80G, and 80R; the electron transport layers 47B, 47G, and 47R; and the cathodes 32B, 32G, and 32R. In some embodiments, the structure of the light-emitting device 1 may be inverted; that is, the cathodes 32B, 32G and 32R, the electron transport layers 47B, 47G and 47R, the light-emitting layers 80B, 80G and 80R, the hole transport layers 46B, 46G and 46R, and the anodes 31B, 31G and 31R may be stacked sequentially on the array substrate 10.

Figure 2:
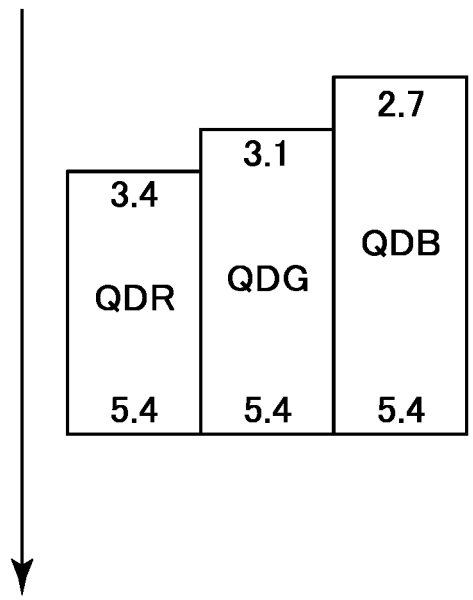
FIG. 2 illustrates example energy indicating the electron affinity and ionization potential of each layer of the light-emitting device according to the first embodiment.
Figure 3:
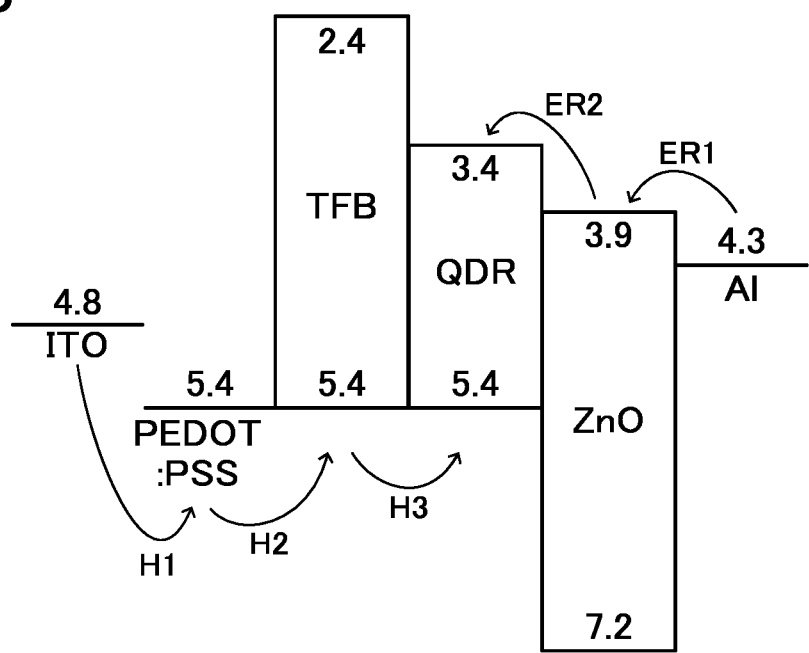
FIG. 3 illustrates example energy indicating the Fermi level or electron affinity and ionization potential of each layer included in a light emitter 3R of the light-emitting device according to the first embodiment.
Figure 4:
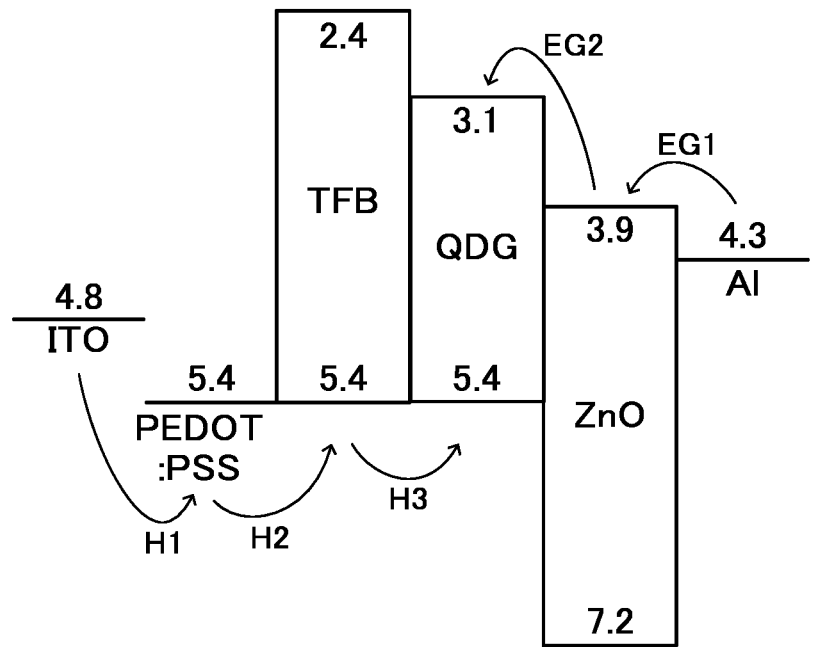
FIG. 4 illustrates example energy indicating the Fermi level or electron affinity and ionization potential of each layer included in a light emitter 3G of the light-emitting device according to the first embodiment.
Figure 5:
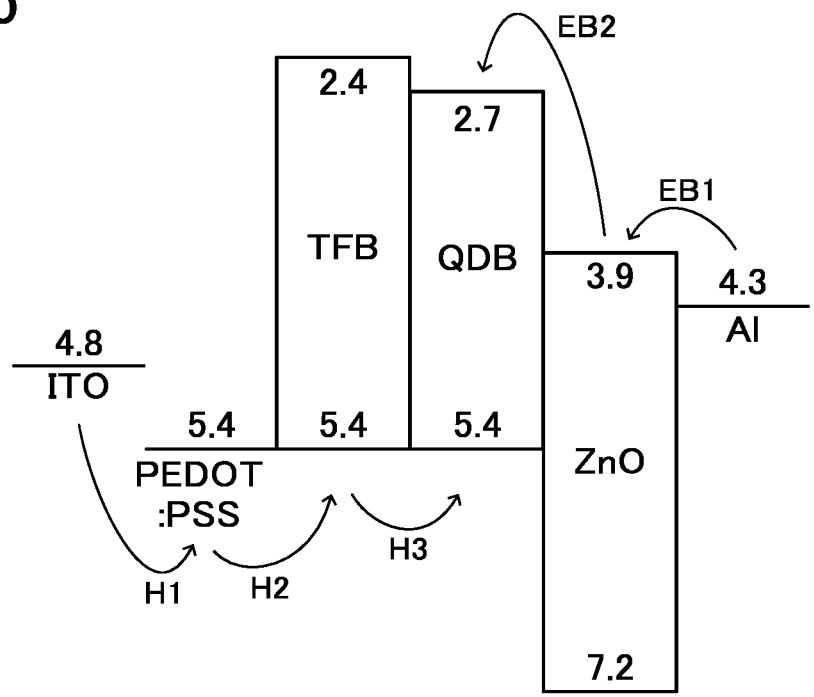
FIG. 5 illustrates example energy indicating the Fermi level or electron affinity and ionization potential of each layer included in a light emitter 3B of the light-emitting device according to the first embodiment.

FIG. 2 illustrates example energy indicating the electron affinity and ionization potential of each of the light-emitting layers 80B, 80G and 80R of the light-emitting device 1 according to the first embodiment. FIG. 2 illustrates, from the left to the right, the energy of the light-emitting layer 80R, the energy of the light-emitting layer 80G, and the energy of the light-emitting layer 80B. When each of the quantum dots 81B, 81G and 81R has a core-shell structure in FIG. 2, FIG. 2 illustrates example energy indicating the electron affinities and ionization potentials of the individual cores of the quantum dots 81B, 81G and 81R, which are respectively included in the light-emitting layers 80B, 80G and 80R. FIG. 3 illustrates example energy indicating the Fermi level or electron affinity and ionization potential of each layer included in the light emitter 3R of the light-emitting device 1 according to the first embodiment. FIG. 4 illustrates example energy indicating the Fermi level or electron affinity and ionization potential of each layer included in the light emitter 3G of the light-emitting device 1 according to the first embodiment. FIG. 5 illustrates example energy indicating the Fermi level or electron affinity and ionization potential of each layer included in the light emitter 3B of the light-emitting device 1 according to the first embodiment. FIG. 3 illustrates, from the left to the right, the energy of the anode 31R, the energy of the hole transport layer 46R, the energy of the light-emitting layer 80R, the energy of the electron transport layer 47R, and the energy of the cathode 32R. FIG. 4 illustrates, individually from the left to the right, the energy of the anode 31G, the energy of the hole transport layer 46G, the energy of the light-emitting layer 80G, the energy of the electron transport layer 47G, and the energy of the cathode 32G. FIG. 5 illustrates, individually from the left to the right, the energy of the anode 31G, the energy of the hole transport layer 46G, the energy of the light-emitting layer 80G, the energy of the electron transport layer 47G, and the energy of the cathode 32G.

The Fermi levels of the individual anodes 31R, 31G and 31B and the Fermi levels of the individual cathodes 32R, 32G and 32B are expressed in the unit eV. The ionization potentials of the individual hole transport layers 46R, 46G and 46B, the ionization potentials of the individual light-emitting layers 80R, 80G and 80B, and the ionization potentials of the individual electron transport layers 47R, 47G and 47B are expressed therebelow in the unit eV with reference to a vacuum level. In addition, the electron affinities of the individual hole transport layers 46R, 46G and 46B, the electron affinities of the individual light-emitting layers 80R, 80G and 80B, and the electron affinities of the individual electron transport layers 47R, 47G and 47B are expressed thereabove in the unit eV with reference to a vacuum level.

The Description will hereinafter describe an ionization potential or an electron affinity with reference to a vacuum level when merely addressing them.

The quantum dots 81B, 81G and 81R in this embodiment contain respective cores belonging to the same composition group. The results of measurements conducted by the inventors have demonstrated that the valence band levels (equal to an ionization potential) of the individual cores are substantially the same irrespective of the wavelength of light emitted by the quantum dots 81B, 81G and 81R when the quantum dots 81B, 81G and 81R have their respective cores belonging to the same material group.

The ionization potentials of the light-emitting layers were measured in the following manner.

The measurements were conducted on the assumption that quantum dots had the substantially same composition, and that the ionization potentials of quantum dots having the same particle diameter (herein, with a tolerance of −2 to +2 nm inclusive) were equal to each other. Here, that the ionization potentials are equal to each other includes a tolerance of −0.1 to +0.1 eV inclusive.

The inventors firstly cut the display through laser cutting to expose the sections of the individual light-emitting layers. The inventors then observed the exposed sections by SEM-EDX to identify the composition and particle diameter of the quantum dots. To be specific, the composition of the quantum dots was CdSe. The inventors calculated the particle diameter of the quantum dots by freely selecting about 100 quantum dots within the quantum dot layer that is about 30 nm thick and included in a field of view about 2 to 3 m inclusive, then measuring the area of each selected quantum dot, and then determining the mean value of the diameters of circles having the measured area. The particle diameter of the quantum dots stood at 5 nm.

The inventors then produced quantum dots having the identified composition and identified particle diameter. The inventors next dispersed the produced quantum dots into an organic solvent, such as hexane or toluene, and then adjusted the dispersed solution. The inventors next applied the adjusted dispersed solution onto an ITO film on a glass substrate having a main surface with an indium tin oxide (ITO) film (70 nm thick) thereon, and then vaporized the organic solvent to thus form a 30 nm thick light-emitting layer, which functioned as a sample for ionization potential measurement.

The produced sample underwent a photoelectron spectroscopy measurement using a photoemission yield spectroscopy in air ("AC-3", made by RIKEN KEIKI Co., Ltd.), thus measuring the ionization potential.

To be specific, the inventors fixed input power at such a power level that a peak observed at around 4.8 eV and resulting from the ITO film is not observed substantially, and the inventors measured quantum yield while changing electron volt (eV), to thus determine the relationship between the electron volt and quantum yield. As a result, the inventors specified, as an ionization potential, the electron volt at which the quantum yield rises when the electron volt is increases.

The ionization potentials of the quantum dots 81B, 81G and 81R are equal to each other and stand at 5.4 eV. That the ionization potentials are equal to each other includes a tolerance of −0.1 to +0.1 eV inclusive.

In contrast, the conduction band levels (equal to an electron affinity) of the quantum dots 81B, 81G and 81R change depending on the wavelength of light emitted by the quantum dots 81B, 81G and 81R even when these dots are made of respective materials belonging to the same group. In particular, the conduction band levels of the quantum dots 81B, 81G and 81R have a deeper energy level along with increase in the wavelength of light emitted by the quantum dots 81B, 81G and 81R, and the conduction band levels thereof have a shallower energy level along with decrease in the wavelength of light emitted by the quantum dots 81B, 81G and 81R.

For instance, the light-emitting layers 80R, 80G and 80B in this embodiment have an ionization potential of 5.4 eV, which is substantially the same between different sub-pixels, as illustrated in FIG. 2, whereas the light-emitting layers 80R, 80G and 80B in this embodiment have an electron affinity of 3.4 eV, an electron affinity of 3.1 eV, and an electron affinity of 2.7 eV, respectively. The electron affinity of the quantum dot 81B is smaller than the electron affinity of the quantum dot 81G, as described above. In addition, the electron affinity of the quantum dot 81G is smaller than the electron affinity of the quantum dot 81R.

As illustrated in FIGS. 3 to 5, the light emitters 3R, 3G, and 3B are configured, for instance, such that the anodes 31R, 31G, and 31B each contain ITO, such that the hole transport layers 46R, 46G, and 46B each have a layer containing PEDOT:PSS and a layer containing TFB, such that the electron transport layers 47R, 47G, and 47B each contain ZnO, and such that the cathodes 32R, 32G, and 32B contain Al.

In this case, each of the anodes (ITO) 31R, 31G and 31B has a Fermi level of 4.8 eV. The PEDOT:PSS-containing layers in the hole transport layers 46R, 46G and 46B each have a Fermi level of 5.4 eV. The TFB-containing layers in the hole transport layers 46R, 46G and 46B each have an ionization potential of 5.4 eV and an electron affinity of 2.4 eV. In this way, the hole transport materials contained in the respective hole transport layers 46R, 46G and 46B have ionization potentials equal to each other. Further, the hole transport materials contained in the respective hole transport layers 46R, 46G and 46B have electron affinities equal to each other. That the ionization potentials are equal to each other includes a tolerance of −0.1 to +0.1 eV inclusive. Further, that the electron affinities are equal to each other includes a tolerance of −0.1 to +0.1 eV inclusive.

The electron transport layers (ZnO) 47R, 47G, and 47B each have an ionization potential of 7.2 eV and an electron affinity of 3.9 eV. The electron transport materials contained in the respective electron transport layers 47R, 47G and 47B have ionization potentials equal to each other. Further, the electron transport materials contained in the respective electron transport layers 47R, 47G and 47B have electron affinities equal to each other. That the ionization potentials are equal to each other includes a tolerance of −0.1 to +0.1 eV inclusive. Further, that the electron affinities are equal to each other includes a tolerance of −0.1 to +0.1 eV inclusive.

Each of the cathode (Al) 32R, 32G and 32B has a Fermi level of 4.3 eV.

How holes and electrons are transferred in each layer of the light emitters 3R, 3G and 3B will be next described with reference to FIGS. 3 to 5.

Upon a potential difference being produced between the anodes 31R, 31G and 31B and the cathodes 32R, 32G and 32B in the light-emitting device 1, holes are injected from the anodes 31R, 31G and 31B into the PEDOT:PSS-containing layers of the individual hole transport layers 46R, 46R and 46G, as denoted by an arrow H1 in FIGS. 3 and 5. Likewise, as denoted by arrows ER1, EG1 and EB1 in FIGS. 3 to 5, electrons are injected from the cathodes 32R, 32G and 32B into the electron transport layers (ZnO) 47R, 47G and 47B of the respective light emitters 3R, 3G and 3B.

Here, a barrier to hole transport from a first layer to a second layer, different from the first layer, for instance is indicated by energy obtained by subtracting the ionization potential of the first layer from the ionization potential of the second layer. A barrier to hole injection denoted by the arrow H1 thus measures 0.6 eV irrespective of the kind of the light emitters 3R, 3G and 3B.

A barrier to electron transport from the first layer to the second layer, different from the first layer, for instance is indicated by energy obtained by subtracting the electron affinity of the second layer from the electron affinity of the first layer. Barriers to hole injection denoted by the respective arrows ER1, EG1 and EB1 measure the same value, i.e., 0.4 eV in this embodiment.

As denoted by an arrow H2 in FIGS. 3 to 5, the barrier to hole transport from the PEDOT:PSS-containing layers of the respective hole transport layers 46R, 46G and 46B to the TFB-containing layers of the respective hole transport layers 46R, 46G and 46B measures 0 eV. Further as illustrated in an arrow H3, the barrier to hole transport from the TFB-containing layers of the respective hole transport layers 46R, 46G and 46B to the light-emitting layers 80R, 80G and 80B measures 0 eV.

As denoted by arrows ER2, EG2 and EB2 in FIGS. 3 to 5, the light emitters 3R, 3G and 3B are configured such that the electrons injected into the respective electron transport layers (ZnO) 47R, 47G and 47B are transferred to the respective light-emitting layers 80R, 80G and 80B. Here, the barrier to electron transport denoted by the arrow ER2 measures 0.5 eV, the barrier to electron transport denoted by the arrow EG2 measures 0.8 eV, and the barrier to electron transport denoted by the arrow EB2 measures 1.2 eV. As such, among the barriers used for electron transport from the electron transport layers (ZnO) 47R, 47G and 47B to the light-emitting layers 80R, 80G and 80B, the barrier to transport from the electron transport layer 47R to the light-emitting layer 80R is the smallest, the barrier to transport from the electron transport layer 47G to the light-emitting layer 80G is the second smallest, and the barrier to transport from the electron transport layer 47B to the light-emitting layer 80B is the largest.

The holes and electrons transported to the light-emitting layers 80R, 80G and 80B in this way rejoin together within the quantum dots 81R, 81G and 81B, and thus each of the quantum dots 81R, 81G and 81B emits light.

Here, a balance (carrier balance) needs to be achieved between the number of holes injected into each of the quantum dots 81R, 81G and 81B and the number of electrons injected into each of the quantum dots 81R, 81G and 81I, in order for each of the quantum dots 81R, 81G and 81B to emit light at high efficiency.

The light-emitting device 1 according to this embodiment is configured such that the thickness T1 of the light-emitting layer 80B is larger than the thickness T2 of the light-emitting layer 80G, as shown in FIG. 1. This configuration can improve the carrier balance within the light-emitting layer 80G, thus improving the internal quantum efficiency of the light-emitting layer 80G. In addition, the thickness T2 of the light-emitting layer 80G is larger than the thickness T3 of the light-emitting layer 80R.

Such a configuration, i.e., the thickness T1 of the light-emitting layer 80B>the thickness T2 of the light-emitting layer 80G>the thickness T3 of the light-emitting layer 80R, can improve the carrier balance in each of the light-emitting layers 80B and 80G, thereby enhancing the internal quantum efficiency in each of the light-emitting layers 80B and 80G. The following describes the details.

That is, as described with reference to FIGS. 2 to 5, the valence band levels of the respective light-emitting layers 80R, 80G and 80B are equal to each other irrespective of the wavelength of light emitted therefrom. As illustrated in FIGS. 2 to 5 in contrast, the conduction band levels of the respective light-emitting layers 80R, 80G and 80B are ranked in the order of their bandgaps; that is, the light-emitting layer 80R has the deepest conduction band level of the three, the light-emitting layer 80G has a shallower conduction band level than the light-emitting layer 80R, and the light-emitting layer 80B has the shallowest conduction band level of the three. The light-emitting layer 80R is hence most likely to receive electrons of the three light-emitting layers 80R, 80G and 80B. The light-emitting layer 80G is less likely to receive electrons than the light-emitting layer 80R, and furthermore, the light-emitting layer 80B is less likely to receive electrons than the light-emitting layer 80G. The number of electrons with respect to the number of holes within a layer hence tends to be smaller in the light-emitting layer 80G than in the light-emitting layer 80R. Furthermore, the number of electrons with respect to the number of holes within a layer tends to be smaller in the light-emitting layer 80B than in the light-emitting layer 80G.

Figure 6:
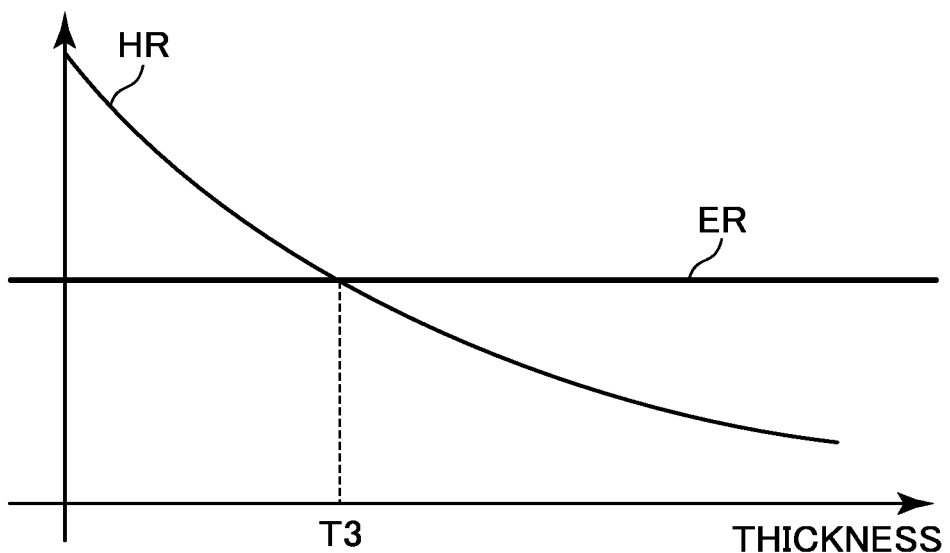
FIG. 6 is a graph showing carrier distribution within a light-emitting layer 80R of the light-emitting device according to the first embodiment.
Figure 7:
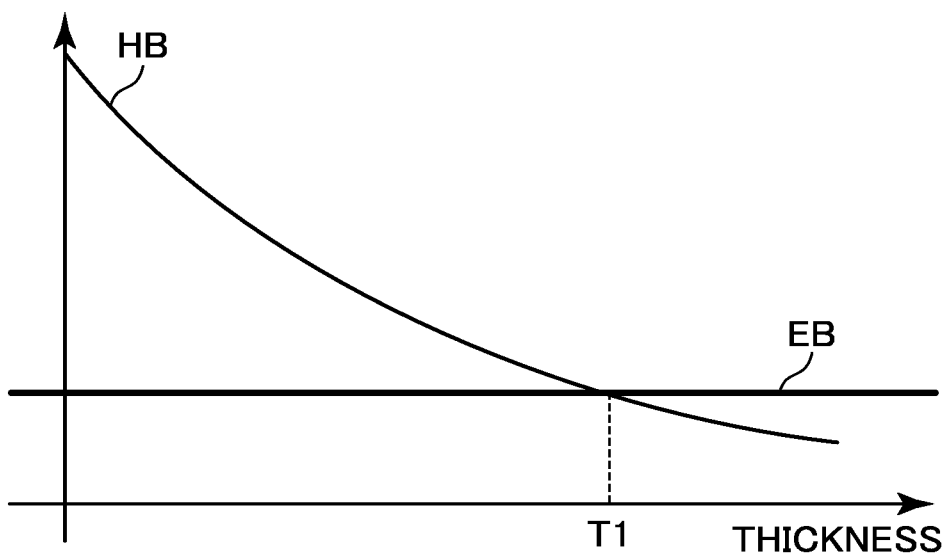
FIG. 7 is a graph showing carrier distribution within a light-emitting layer 80B of the light-emitting device according to the first embodiment.

FIG. 6 is a graph showing carrier distribution within the light-emitting layer 80R. FIG. 7 is a graph showing carrier distribution within the light-emitting layer 80B. In both FIGS. 6 and 7, the lateral axes indicate the thicknesses of the respective light-emitting layers, and the longitudinal axes indicate the number of carriers (holes or electrons).

Referring to carrier (holes and electrons) mobility within the corresponding light-emitting layer, the mobility of holes is lower than the mobility of electrons, as shown in FIGS. 6 and 7. In other words, the holes have a shorter diffusion length in the direction of thickness within the light-emitting layer than the electrons. The holes injected into each light-emitting layer hence exhibit such a distribution that the number of holes decreases exponentially along with distance in the thickness direction of the light-emitting layer from the hole transport layer toward the electron transport layer (i.e., along with approach to the right in FIGS. 6 and 7). The electrons injected into each light-emitting layer in contrast exhibit an approximately constant distribution in the thickness direction of the light-emitting layer. However, the number of electrons with respect to the number of holes within a layer tends to be smaller in the light-emitting layer 80B than in the light-emitting layer 80R, as illustrated in FIGS. 3 and 5. In addition, the thickness T1 of the light-emitting layer 80B that minimizes electrons that do not contribute to light emission among the electrons injected into the light-emitting layer 80B (i.e., the thickness T1 with the carrier balance improved) is larger than the thickness T3 of the light-emitting layer 80R that minimizes electrons that do not contribute to light emission among the electrons injected into the light-emitting layer 80R, as shown in FIGS. 6 and 7. Referring to the light-emitting layer 80G likewise, its thickness T2 that minimizes electrons that do not contribute to light emission (i.e., the thickness T2 with the carrier balance improved) is larger than the thickness T3 and is smaller than the thickness T1.

For instance, the ratio of thickness between T3, T2 and T1 preferably stands at 1.0:2.0:3.7. For instance, the thickness T3 preferably ranges from 10 to 20 nm inclusive. Further, the thickness T2 preferably ranges from 25 to 35 nm inclusive. Further, the thickness T1 preferably ranges from 50 to 60 nm inclusive.

That is, the following relational expression (Expression 3) is preferably established between the thicknesses T1 and T2, for instance.

$$1.3 \le T1/T2 \le 2.4 \quad \text{(Expression 3)}$$

Further, the following relational expression (Expression 4) is preferably established between the thicknesses T1 and T3, for instance.

$$2.5 \le T1/T3 \le 6.0 \quad \text{(Expression 4)}$$

These relations improve the carrier balance within each of the light-emitting layers 80R, 80G and 80B, thus achieving enhancement in their internal quantum efficiency. By way of example, the thickness T3 can be set at 15 nm; the thickness T2, at 30 nm; and the thickness T3, at 56 nm.

Figure 8:
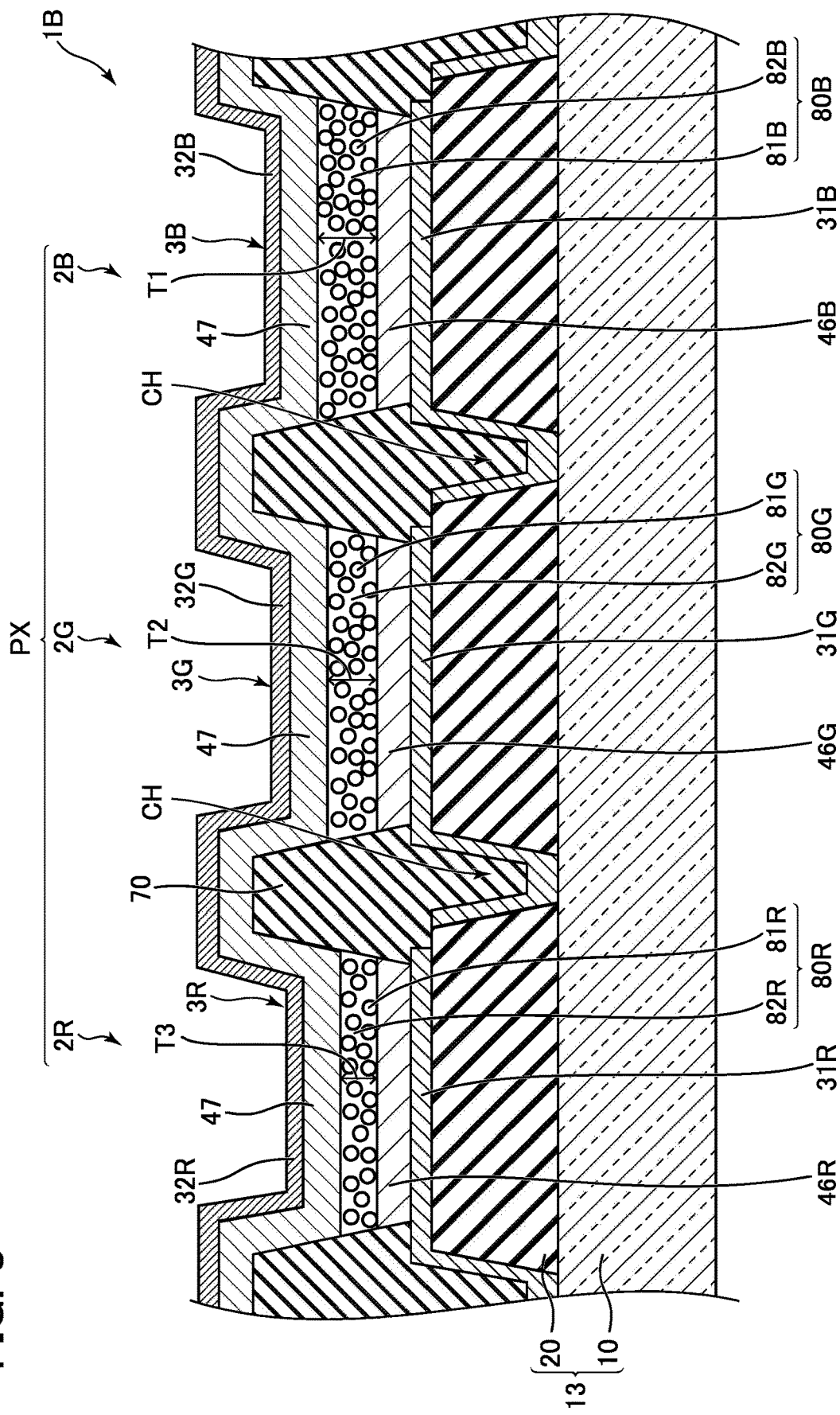
FIG. 8 is a sectional view of a light-emitting device according to a first modification of the first embodiment.

FIG. 8 is a sectional view of a light-emitting device 1B according to a first modification of the first embodiment. The light-emitting device 1B shown in FIG. 8 is different from the light-emitting device 1 shown in FIG. 1 in that the electron transport layers 47B, 47G and 47R are replaced with an electron transport layer 47. The other configuration of the light-emitting device 1B is similar to that of the light-emitting device 1.

The electron transport layer 47 of the light-emitting device 1B is composed of the electron transport layers 47B, 47G and 47R joined together, to thus constitute a single layer extending continuously across the light emitters 3B, 3G and 3R. The electron transport layer 47 can be made of the same material as the electron transport layers 47B, 47G and 47R. The light-emitting device 1B may be configured in this manner.

Figure 9:
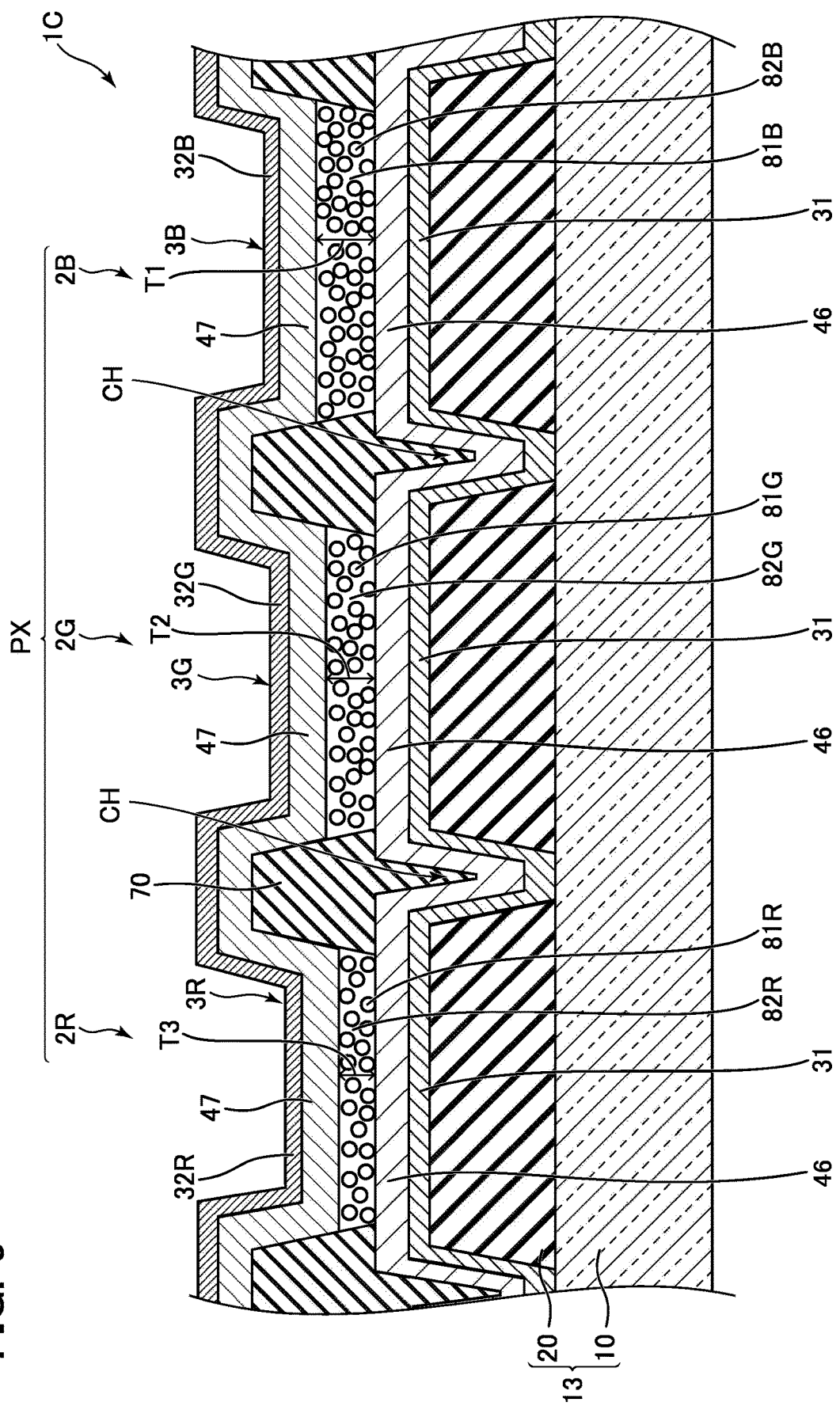
FIG. 9 is a sectional view of a light-emitting device according to a second modification of the first embodiment.

FIG. 9 is a sectional view of a light-emitting device 1C according to a second modification of the first embodiment. The light-emitting device 1C shown in FIG. 9 is different from the light-emitting device 8 shown in FIG. 1 in that the hole transport layers 46B, 46G and 46R are replaced with a hole transport layer 46. The other configuration of the light-emitting device 1C is similar to that of the light-emitting device 1B.

The hole transport layer 46 of the light-emitting device 1C is composed of the hole transport layers 46B, 46G and 46R joined together, to thus constitute a single layer extending continuously across the light emitters 3B, 3G and 3R. The hole transport layer 46 can be made of the same material as the hole transport layers 46B, 46G and 46R. The light-emitting device 1C may be configured in this manner.

Second Embodiment

The following describes a second embodiment. Differences between the first and second embodiments will be mainly described, and redundancies between the first and second embodiments will not be described.

Figure 10:
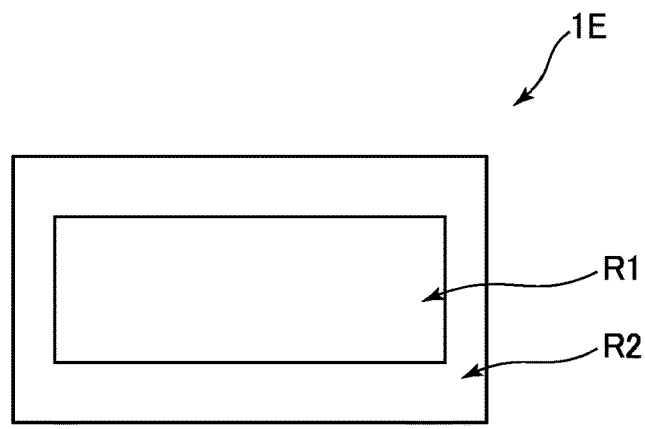
FIG. 10 illustrates the middle region of a light-emitting device according to a second embodiment.

FIG. 10 illustrates the middle region, R1, of a light-emitting device 1E according to the second embodiment. For instance, let the light-emitting device 1E be a portable information terminal, such as a smartphone, and let the light-emitting device 1E have a display panel with pixels PX are arranged thereon, and a battery, which is a power source that supplies power to the display panel, on the backside of the display panel. When the light-emitting device 1E is used in this case, the middle region R1 of the display panel gets hot as a result of an increase in the battery's temperature, whereas a peripheral region R2, located outside the middle region R1, gets cooler than the middle region R1.

For instance, let the light-emitting device 1E be a TV set, and let the light-emitting device 1E have a display panel with pixels PX arranged thereon, a circuit substrate with a power source circuit, and a casing surrounding the perimeters of the display panel and circuit substrate. In addition, let the casing have an exhaust hole for dissipating heat generated from the circuit substrate. When the light-emitting device 1E is used in this case, the heat generated from the circuit substrate is dissipated from the exhaust hole of the casing. Temperature hence tends to get higher near the middle region R1 of the display panel than near the peripheral region R2 of the display panel. As such, the temperature of the display panel of the light-emitting device 1E tends to get higher in the middle region R1 than in the peripheral region R2.

Here, if the temperature of a light emitter rises, the electrical resistance of ITO, which is a semiconductor, gets low, whereas the electrical resistance of Al, which is a metal, gets high, for instance. In addition, if the temperature of the light emitter rises, electrons injected from its electron transport layer into its light-emitting layer go over the barrier between the light-emitting layer and hole transport layer, thus easily causing leakage current. Hence if the temperature of the light emitter rises, the light-emitting layer tends to involve an excess of holes and a shortage of electrons in carrier balance, thus causing reduction in internal quantum efficiency.

Figure 11:
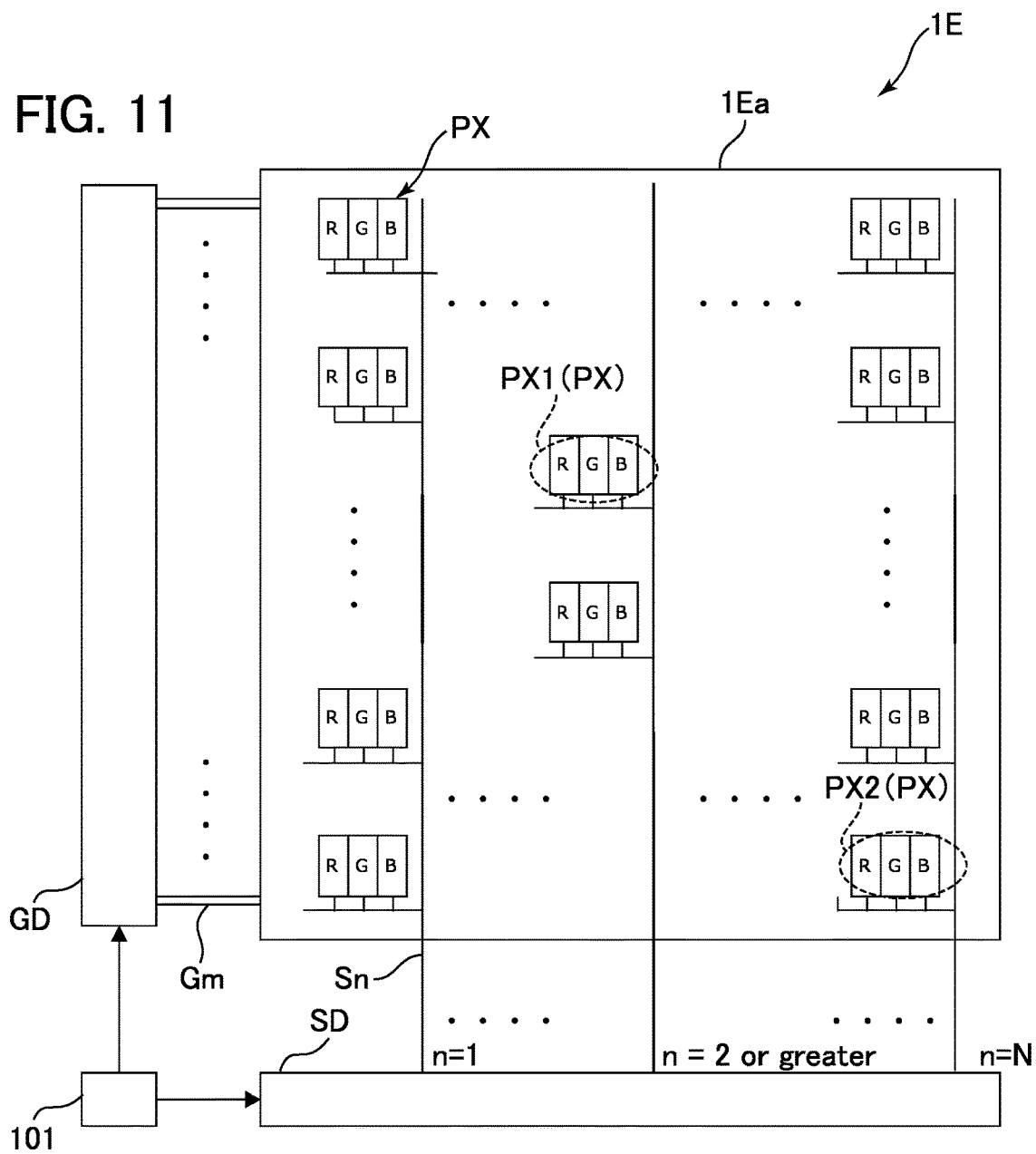
FIG. 11 is a schematic plan view of a display panel and peripheral circuit of the light-emitting device according to the second embodiment.

FIG. 11 is a schematic plan view of a display panel 1Ea of the light-emitting device 1E according to the second embodiment and of a peripheral circuit of the same. As illustrated in FIG. 11, the light-emitting device 1E has the display panel 1Ea, a gate driver GD, a source driver SD, and a display control circuit 101.

The display panel 1Ea has an image display region with pixels PX arranged in matrix therein. The display panel 1Ea has the following: a plurality of data lines Sn (n is an integer ranging from 1 to N) provided for supplying a source signal (data signal) to the pixels PX; and a plurality of gate lines Gm (m is an integer ranging from 1 to M) provided for supplying a gate signal to the pixels PX. The plurality of data lines Sn include one to n number of data lines arranged sequentially in one direction, where n is an integer equal to or greater than three. The plurality of gate lines Gm include one to m number of gate lines arranged sequentially in one direction, where m is an integer equal to or greater than three. The plurality of pixels PX are arranged at points where the plurality of data lines Sn intersect with the plurality of gate lines Gm.

Each of the plurality of data lines Sn has one end connected to the source electrode of the TFT in a corresponding one of the pixels PX and has the other end connected to the source driver SD. Each of the plurality of gate lines Gm has one end connected to the gate electrode of the TFT in a corresponding one of the pixels PX and has the other end connected to the gate driver GD.

The source driver SD may include, but not limited to, a serial-parallel conversion and latch circuit, a DA conversion circuit, an AD conversion circuit, and an input-output buffer circuit. The source driver SD generates a source signal on the basis of an input signal from the display control circuit 101 and supplies the generated source signal to each data line Sn at a predetermined timing. The gate driver GD generates a gate signal on the basis of an input signal from the display control circuit 101 and supplies the generated gate signal to each gate line Gm at a predetermined timing. The TFT of each pixel PX is driven on the basis of the gate signal supplied from the gate line Gm, and the source signal supplied from the data line Sn.

Among the plurality of pixels PX arranged on the display panel 1Ea, a pixel PX included in the middle region R1 will be referred to as a pixel PX1 (first pixel), and a pixel PX included in the peripheral region R2, which is around the middle region R1, will be referred to as a pixel PX2 (second pixel).

For instance, the pixel PX1 is disposed on at least one of the plurality of data lines Sn included in 0.4n or greater and 0.6n or smaller. The pixel PX1 may be disposed on all the plurality of data lines Sn included in 0.4n or greater and 0.6n or smaller. In n=100 for instance, the pixel PX1 is disposed on at least one of the 40th to 60th data lines Sn counted in one direction (for instance, counted from the left to the right). That is, the pixel PX1 can be also described as being disposed on at least one of 20% data lines Sn arranged in the middle of the plurality of data lines.

For instance, the pixel PX2 is disposed on at least one of the plurality of data lines Sn excluding the plurality of data lines Sn included in 0.4n or greater and 0.6n or smaller. The pixel PX2 may be disposed on all the plurality of data lines Sn excluding the plurality of data lines Sn included in 0.4n or greater and 0.6n or smaller. In n=100 for instance, the pixel PX2 is disposed on at least one of the 1st to 39th and 61th to 100th data lines Sn counted in one direction (for instance, counted from the left to the right). That is, the pixel PX2 can be also described as being disposed on at least one of 40% data lines Sn arranged at both ends of the plurality of data lines Sn.

Figure 12:
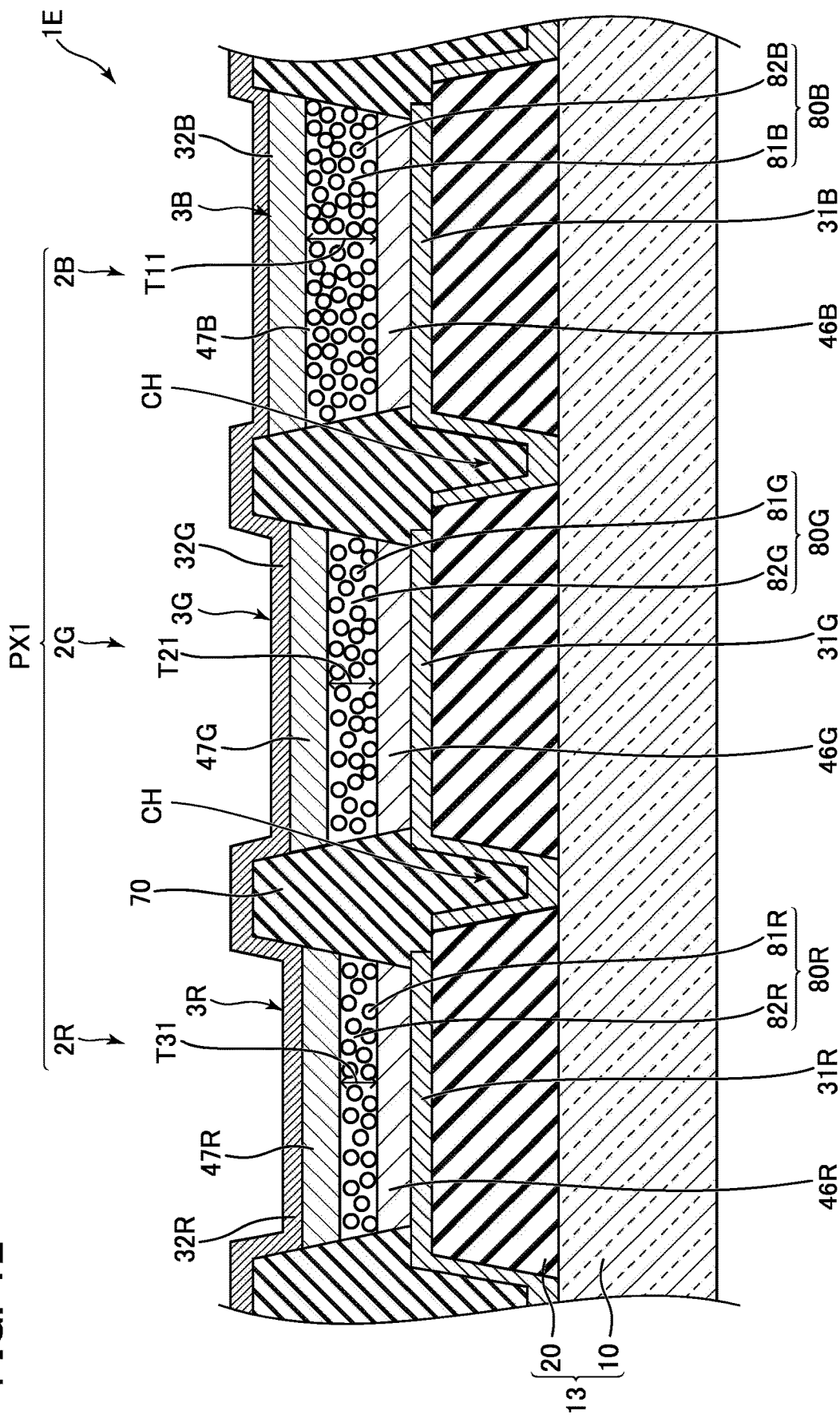
FIG. 12 is a sectional view of a pixel in the middle region of the light-emitting device according to the second embodiment.
Figure 13:
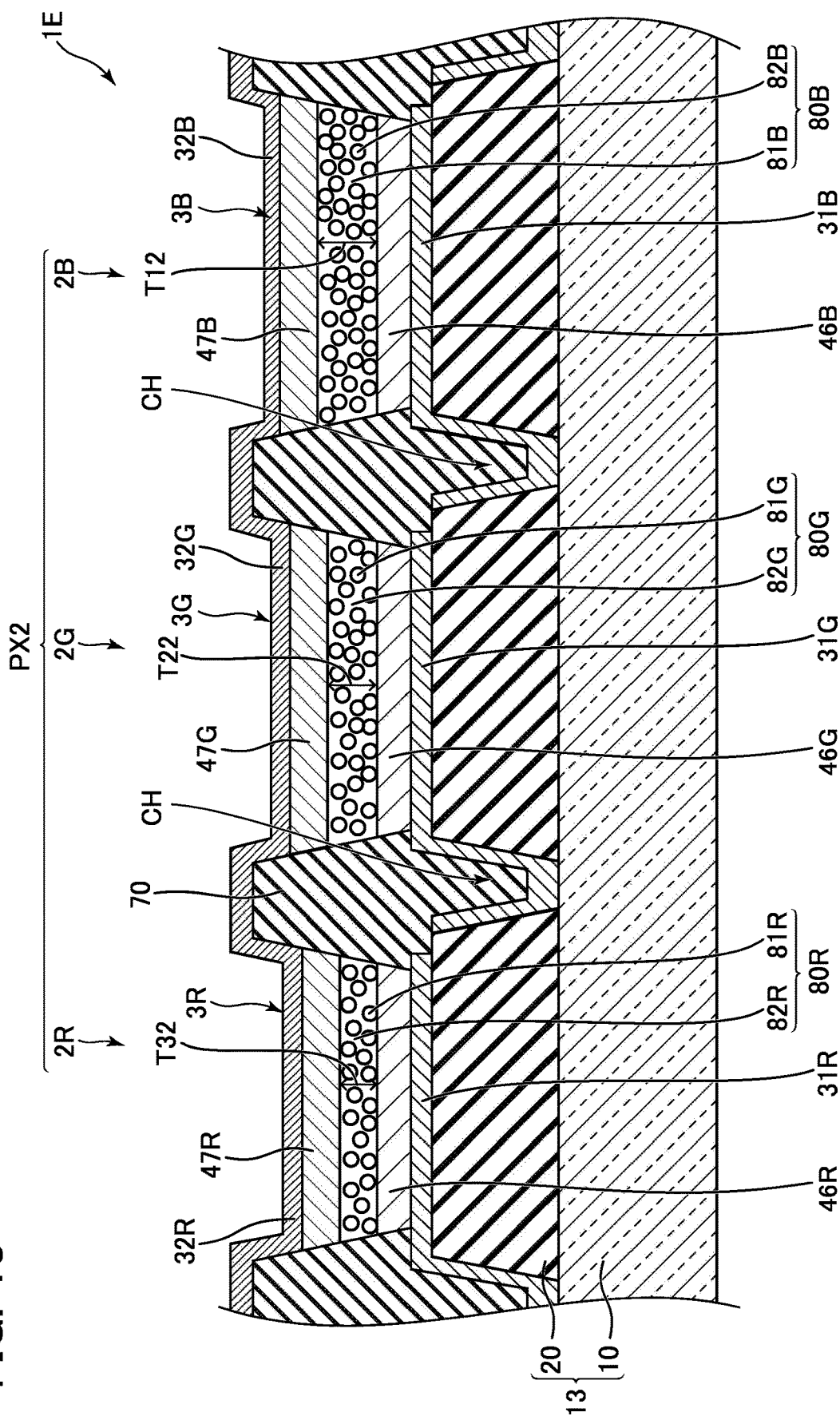
FIG. 13 is a sectional view of a pixel in the peripheral region of the light-emitting device according to the second embodiment.

FIG. 12 is a sectional view of the pixel PX1 in the middle region R1 of the light-emitting device 1E according to the second embodiment. FIG. 13 is a sectional view of the pixel PX2 in the peripheral region R2 of the light-emitting device 1E according to the second embodiment. As illustrated in FIG. 12, the pixel PX1 of the light-emitting device 1E includes the following: the light-emitting layer 80B having a thickness T11; the light-emitting layer 80G having a thickness T21; and the light-emitting layer 80R having a thickness T31. As illustrated in FIG. 13, the pixel PX2 of the light-emitting device 1E includes the following: the light-emitting layer 80B having a thickness T12; the light-emitting layer 80G having a thickness T22; and the light-emitting layer 80R having a thickness T32. As illustrated in FIGS. 12 and 13, the light-emitting device 1E is configured such that the thickness T12 of the light-emitting layer 80B of the pixel PX2 is smaller than the thickness T11 of the light-emitting layer 80B of the pixel PX1. This configuration can prevent a shortage of electrons within the light-emitting layer 80B of the pixel PX1 even when the temperature of the pixel PX1 gets higher than the temperature of the pixel PX2, thereby preventing an increase in the difference between the carrier balance of the light-emitting layer 80B of the pixel PX1 and the carrier balance of the light-emitting layer 80B of the pixel PX2. That is, the foregoing configuration can prevent an increase in the difference between the internal quantum efficiency of the light-emitting layer 80B of the pixel PX1 and the internal quantum efficiency of the light-emitting layer 80B of the pixel PX2. This can prevent in-plane brightness unevenness in the display panel 1Ea even when the temperature of the middle region R1 gets higher than the temperature of the peripheral region R2.

The light-emitting device 1E may be configured such that the thickness T22 of the light-emitting layer 80G of the pixel PX2 is smaller than the thickness T21 of the light-emitting layer 80G of the pixel PX1. The light-emitting device 1E may be also configured such that the thickness T32 of the light-emitting layer 80R of the pixel PX2 is smaller than the thickness T31 of the light-emitting layer 80R of the pixel PX1. This configuration can further prevent in-plane brightness unevenness in the display panel 1Ea.

Figure 14:
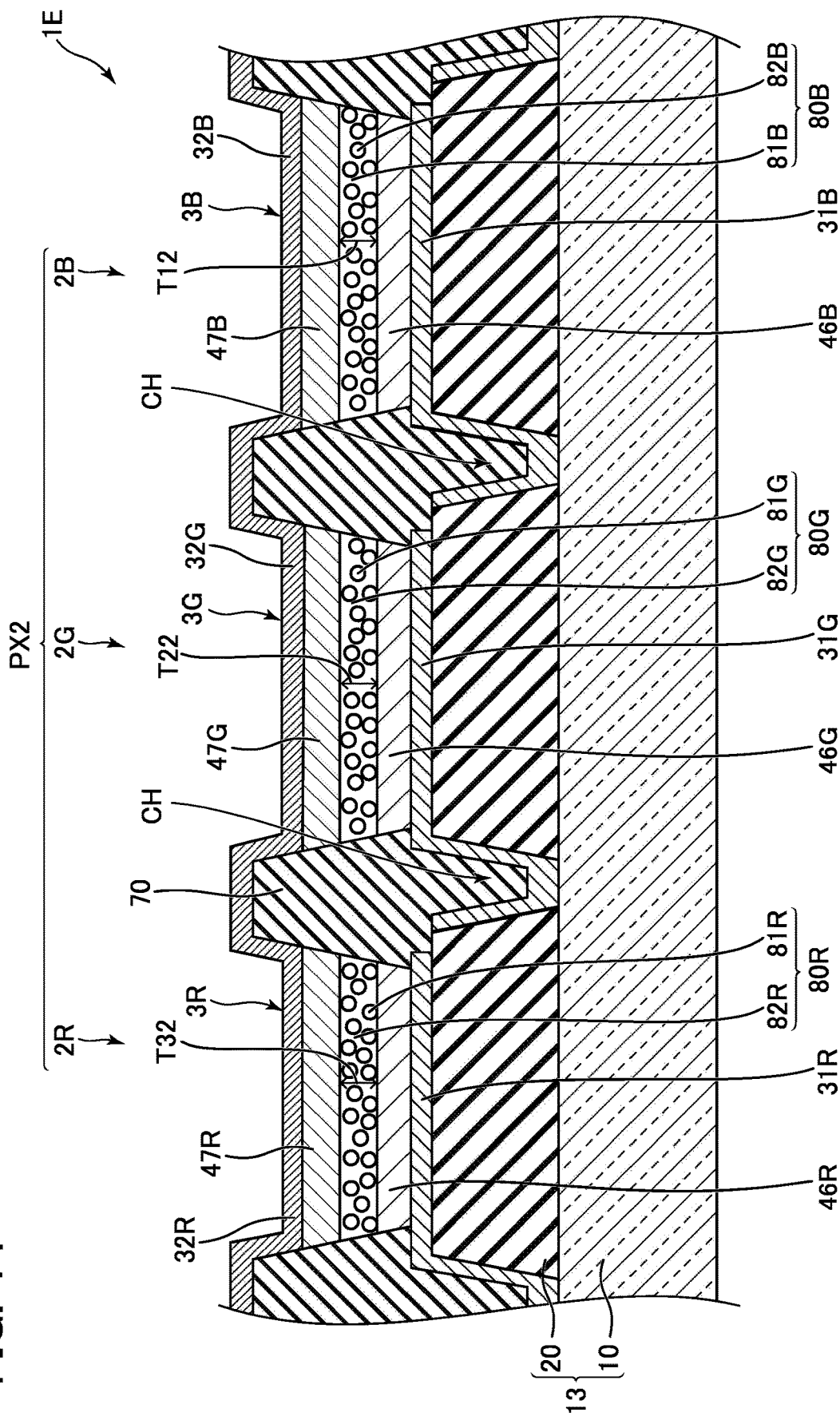
FIG. 14 is a sectional view of a pixel in the peripheral region of a light-emitting device according to a modification of the second embodiment.

FIG. 14 is a sectional view of the pixel PX2 in the peripheral region R2 of the light-emitting device 1E according to a modification of the second embodiment. The pixel PX2 may be configured such that the thickness T12 of the light-emitting layer 80B, the thickness T22 of the light-emitting layer 80G, and the thickness T32 of the light-emitting layer 80R are equal to each other, as illustrated in FIG. 14. For instance, the thicknesses T12, T22 and T32 may be set at about 15 nm.

Here, the light-emitting layers 80B, 80G and 80R are formed by applying a solution with quantum dots dispersed therein onto a substrate, followed by heating the substrate with a heater to thus heat the solvent of the dispersed solution to a temperature higher than its boiling point to thus vaporize the solvent. Due to heating unevenness in the heater unfortunately, the temperature of the pixels included in the peripheral region is hard to rise, and the solvent is hard to vaporize. The temperature of the pixels included in the peripheral region is particularly hard to rise when these pixels are close to the end of the substrate, like a display having a narrow frame for instance. The dispersed solution, constituting the forgoing light-emitting layers, is hence hard to vaporize in the peripheral region, thus easily generating thickness unevenness in the light-emitting layers formed.

One method to address this problem is reducing the thicknesses T12, T22 and T32 of the respective light-emitting layers 80B, 80G and 80R included in the peripheral region R2. This method includes reducing the amount of application to the pixel PX2, which is included in the peripheral region R2, in the amount of application of the dispersed solution, which constitutes the light-emitting layers 80B, 80G and 80R. This method can prevent thickness unevenness in each of the light-emitting layers 80B, 80G and 80R formed in the pixel PX2 in the peripheral region R2. This can prevent in-plane brightness unevenness in the display panel 1Ea as well.

The components appeared in the forgoing embodiments and modifications may be combined as appropriate unless otherwise contradicted.

The invention claimed is:

1. A light-emitting device comprising:
a plurality of pixels, wherein one of the plurality of pixels has:
  a first sub-pixel provided with a first light emitter, and
  a second sub-pixel provided with a second light emitter,
the first light emitter has:
  a first cathode,
  a first anode, and
  a first light-emitting layer containing a first quantum dot and disposed between the first cathode and the first anode,
the second light emitter has:
  a second cathode,
  a second anode, and
  a second light-emitting layer containing a second quantum dot and disposed between the second cathode and the second anode, the second quantum dot being configured to emit light having a light-emission wavelength longer than a light-emission wavelength of the first quantum dot,
the first light-emitting layer is thicker than the second light-emitting layer,
an ionization potential of the first quantum dot and an ionization potential of the second quantum dot are equal to each other, and
an electron affinity of the first quantum dot is smaller than an electron affinity of the second quantum dot.

* * * * *